(12) United States Patent
Hauk, Jr.

(10) Patent No.: US 6,178,097 B1
(45) Date of Patent: Jan. 23, 2001

(54) RF SHIELD HAVING REMOVABLE COVER

(75) Inventor: Karel Hauk, Jr., Warrenville, IL (US)

(73) Assignee: Dial Tool Industries, Inc., Addison, IL (US)

(*) Notice: Under 35 U.S.C. 154(b), the term of this patent shall be extended for 0 days.

(21) Appl. No.: 09/234,851

(22) Filed: Jan. 22, 1999

(51) Int. Cl.[7] .................................... H05K 9/00
(52) U.S. Cl. ................ 361/816; 361/800; 174/35 R; 206/719
(58) Field of Search .................. 361/752, 753, 361/800, 816, 818; 174/35 R, 67, 65 R; 206/719

(56) References Cited

U.S. PATENT DOCUMENTS

| | | |
|---|---|---|
| 4,370,515 | 1/1983 | Donaldson . |
| 4,749,821 | 6/1988 | Linton et al. . |
| 4,754,101 | 6/1988 | Stickney et al. . |
| 4,833,276 | 5/1989 | Ito . |
| 4,838,475 | 6/1989 | Mullins et al. . |
| 5,001,298 | 3/1991 | Jong . |
| 5,045,973 | 9/1991 | Saarela et al. . |
| 5,095,177 | 3/1992 | Johnson . |
| 5,175,395 | 12/1992 | Moore . |
| 5,297,007 | 3/1994 | Deyo et al. . |
| 5,335,147 | 8/1994 | Weber . |
| 5,365,410 | 11/1994 | Lonka . |
| 5,400,949 | 3/1995 | Hirvonen et al. . |
| 5,436,802 | 7/1995 | Trahan et al. . |
| 5,495,399 | 2/1996 | Gore et al. . |
| 5,530,202 | 6/1996 | Dais et al. . |
| 5,576,513 | 11/1996 | Günther et al. . |
| 5,596,487 | 1/1997 | Castaneda et al. . |
| 5,614,694 | 3/1997 | Gorenz, Jr. et al. . |
| 5,633,786 | 5/1997 | Matuszewski et al. . |
| 5,742,004 | 4/1998 | Greco et al. . |

*Primary Examiner*—Jayprakash N. Gandhi
(74) *Attorney, Agent, or Firm*—Marshall, O'Toole, Gerstein, Murray & Borun

(57) ABSTRACT

An RF shield having a removable cover is disclosed. An RF shield for shielding an electronic component comprises a plurality of sidewalls and an interconnecting top wall, with the sidewalls and the top wall enclosing a cavity adapted to receive therein the electrical component to be shielded. The top wall is constructed of a first thickness and includes a frangible connection defined by at least one score line circumscribing a removable central portion. The score line has a second thickness less than the first thickness. The frangible connection may be severed in response to the application of a force on the central portion, thereby permitting removal of the central portion to form an access opening.

19 Claims, 7 Drawing Sheets

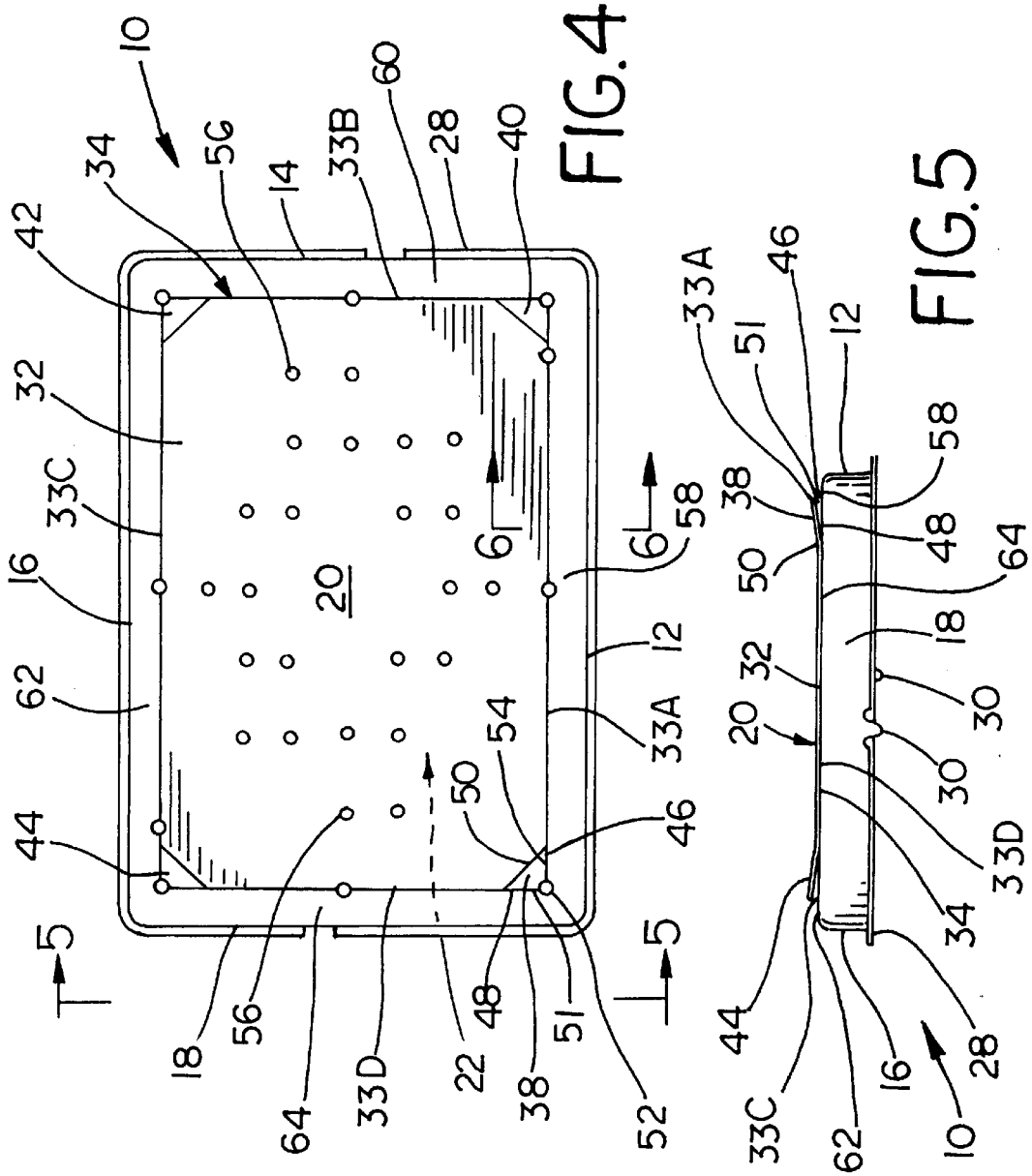

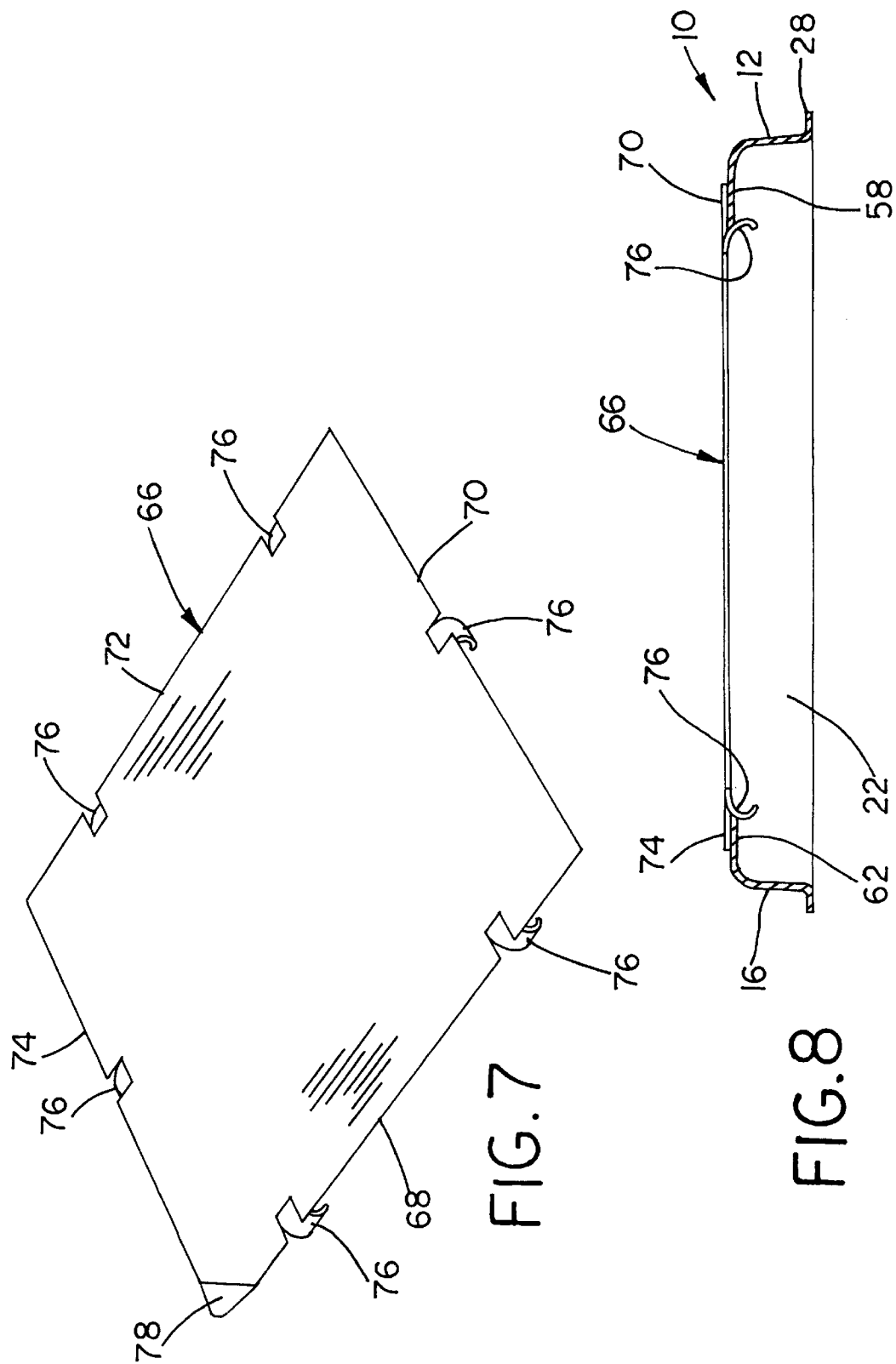

RF SHIELD HAVING REMOVABLE COVER

FIELD OF THE INVENTION

The present invention relates to a Radio Frequency (RF) shield having a removable cover.

BACKGROUND OF THE INVENTION

In electronic device, selected components need to be shielded from RF interference (RF interference) in order to function properly. A Radio Frequency shield (RF shield) is a protective cover frequently installed in a device over a selected one of the electronic components in order to shield that electronic component from the interfering effects of RF produced by other components in the device. A typical RF shield may be constructed of metal and includes a plurality of sidewalls and an interconnecting top wall defining a generally five-sided enclosure or cavity. The cavity is sized to receive therein the selected electronic component, which is typically mounted on a substrate.

Unfortunately, the shielded electronic component may require maintenance during its service life, or the component may need to be completely replaced in the event of a total failure. In such circumstances, it is desirable to have access to the electronic component without having to completely remove the shield from the substrate. Consequently, RF shields having openable lids or removable covers have been developed. The design and operation of such RF shields varies greatly, with each design having its disadvantages.

Accordingly, there exists a continuing need for an improved RF shield having a removable cover in order to provide access to the electronic component shielded therewithin.

SUMMARY OF THE INVENTION

According to one aspect of the invention an RF shield for shielding an electronic component comprises a plurality of sidewalls and an interconnecting top wall, with the sidewalls and the top wall enclosing a cavity adapted to receive therein the electrical component to be shielded. The top wall is constructed of a first thickness and includes a frangible connection generally circumscribing and defining a removable central portion. The frangible connection is defined in part by a plurality of score lines, with each of the score lines having a second thickness less than the first thickness. The frangible connection is severable in response to the application of a force on the central portion, thereby permitting removal of the central portion to form an access opening.

The central portion preferably includes one or more upwardly deflected corner portions defining a tool insertion aperture. Each of the corner portions may be defined by a pair of the score lines intersecting at a vertex. Further, each of the pair of score lines preferably includes an end portion disposed adjacent to the vertex, with each end portion penetrating fully through the first thickness.

A replacement cover or "on-sert" is preferably provided to cover the access opening. The top wall includes a plurality of outer edge portions, with each of the outer edge portions being defined in part by an adjacent one of the score lines. The replacement cover is adapted to engage the outer edge portions to thereby secure the replacement cover over the access opening.

In accordance with another aspect of the invention, an RF shield is adapted for connection to a substrate, and comprises a plurality of sidewalls and an interconnecting top wall. The sidewalls and the top wall, along with the substrate, form a cavity sized to receive therein an electrical component to be shielded. The top wall has a first thickness and includes a frangible connection generally circumscribing and defining a removable central portion. The frangible connection is defined in part by a plurality of score lines, with each of the score lines having a second thickness less than the first thickness. At least one upwardly deflected portion is formed in the central portion, with the upwardly deflected portion being defined in part by a score line extending fully through the first thickness. The frangible connection may be severed in response to the application of an upward force, such as a prying force, on the central portion, which thereby permits removal of the central portion to form an access opening.

In accordance with yet another aspect of the invention, an RF shield comprises a plurality of sidewalls and an interconnecting top wall, with the sidewalls and the top wall forming a cavity sized to receive therein an electrical component to be shielded. The top wall is constructed of a first thickness and includes a frangible connection generally circumscribing a removable central portion. The frangible connection is defined in part by a plurality of shear lines, with each of the shear lines having a second thickness less than the first thickness. A tool insertion aperture is formed in the central portion, with the tool insertion aperture being defined in part by a score line penetrating fully through the first thickness. The tool insertion aperture is defined in part by an upwardly deflected portion formed in the central portion. The frangible connection and the tool insertion aperture thereby permit the separation of the central portion from the top wall to form an access opening upon the application of an upward prying force caused by a tool inserted into the tool insertion aperture.

According to still another aspect of the invention, an RF shield comprises a sidewall and an interconnecting planar top wall. The sidewall and the top wall form a cavity sized to receive therein an electrical component to be shielded. The top wall has a first thickness and includes a removable central portion being circumscribed by a line of separation. The line of separation is defined by a shear line having a second thickness less than the first thickness. Accordingly, the central portion is removable along the line of separation by applying a prying force, thereby creating an access opening.

These and other advantages and features of the invention will become readily apparent to those skilled in the art upon a reading of the following description.

BRIEF DESCRIPTION OF THE DRAWINGS

In the course of the following detailed description, reference will be made to the attached drawings wherein like reference numerals identify like parts and wherein:

FIG. 4 is an elevational view of the RF shield shown in FIGS. 1 and 2;

FIG. 5 is a plan view of the RF shield shown in FIGS. 1, 2 and 4;

FIG. 7 is a perspective view of a replacement cover constructed in accordance with the teachings of the present invention which is adapted to replace the removable central portion of the top wall;

FIG. 8 is a cross-sectional view of the replacement cover shown installed over the access opening.

DETAILED DESCRIPTION OF THE PREFERRED EMBODIMENT

The embodiment described herein is not intended to limit the scope of the invention to the precise form disclosed. The embodiment has been chosen and described in order to explain the principles of the invention and its practical use in order to enable others skilled in the art to follow its teachings.

Figure 9:
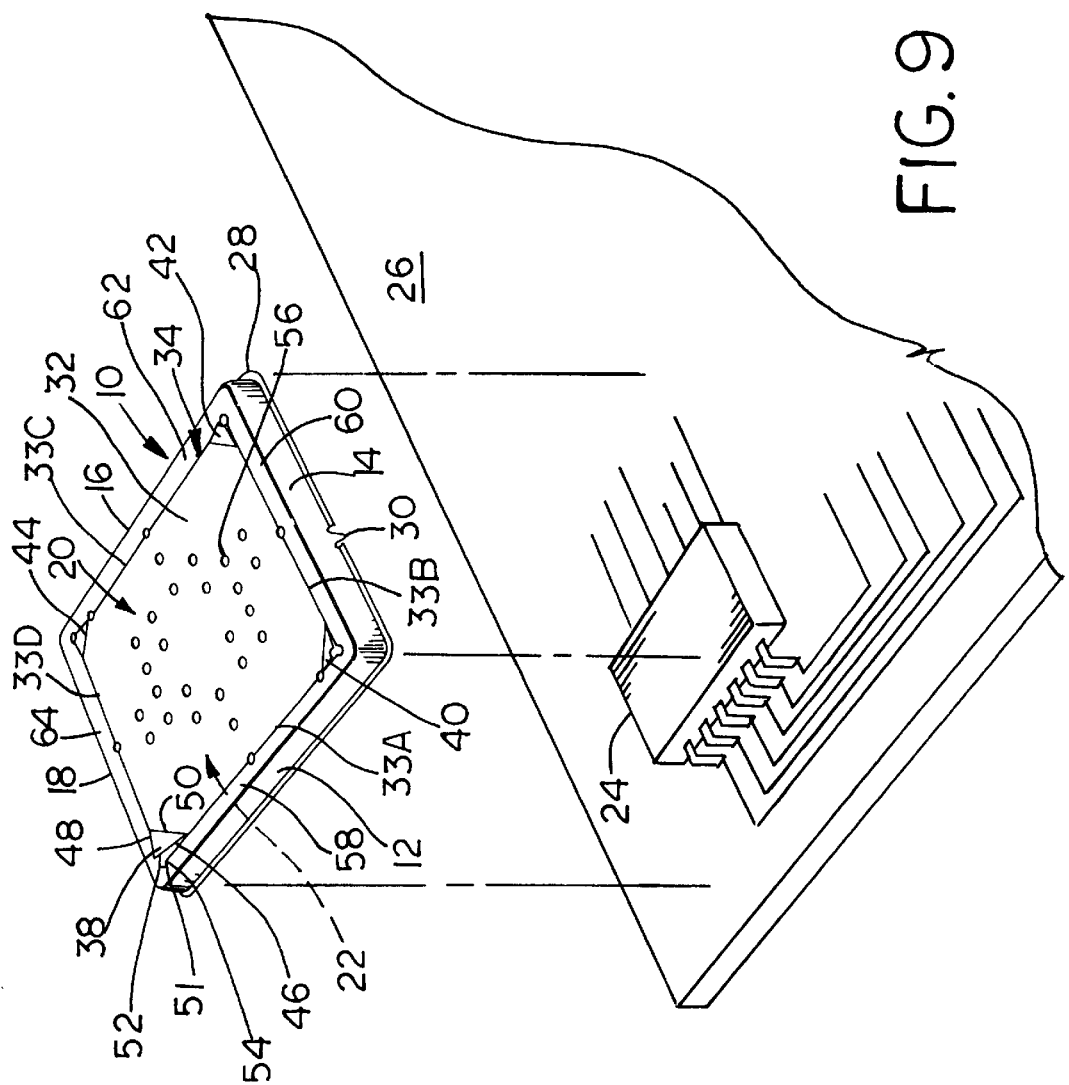
FIG. 9 is a perspective view of an RF shield shown being installed over a selected electronic component on an electronic device.

Referring now to the drawings, an RF shield constructed in accordance with the teachings of the present invention is generally referred to by the reference numeral 10. The RF shield 10 is preferably constructed of metal, such as Cold Rolled Steel, Nickel Silver, or from other suitable materials as would be known to those of skill in the art. The RF shield 10 includes four sidewalls 12, 14, 16 and 18, and also includes an interconnecting top wall 20. The sidewalls 12, 14, 16 and 18, along with the top wall 20 generally define an enclosure or cavity 22. As can be seen in FIG. 9, when the RF shield 10 is positioned as shown over a selected electronic component 24 attached to a conventional printed circuit board or substrate 26, the cavity 22 faces in a generally downward direction, so as to enable the RF shield 10 to cover the electronic component 24 in a conventional manner. Although the RF shield 10 is shown as being substantially rectangular in shape, it will be understood that other shapes may be employed.

Each of the sidewalls 12, 14, 16 and 18 preferably flares outwardly to form a peripheral flange 28. Additionally, one or more of the sidewalls 12, 14, 16 or 18 may include one or more mounting projections 30 to facilitate attachment of the RF shield 10 to the substrate 26.

Figure 6:
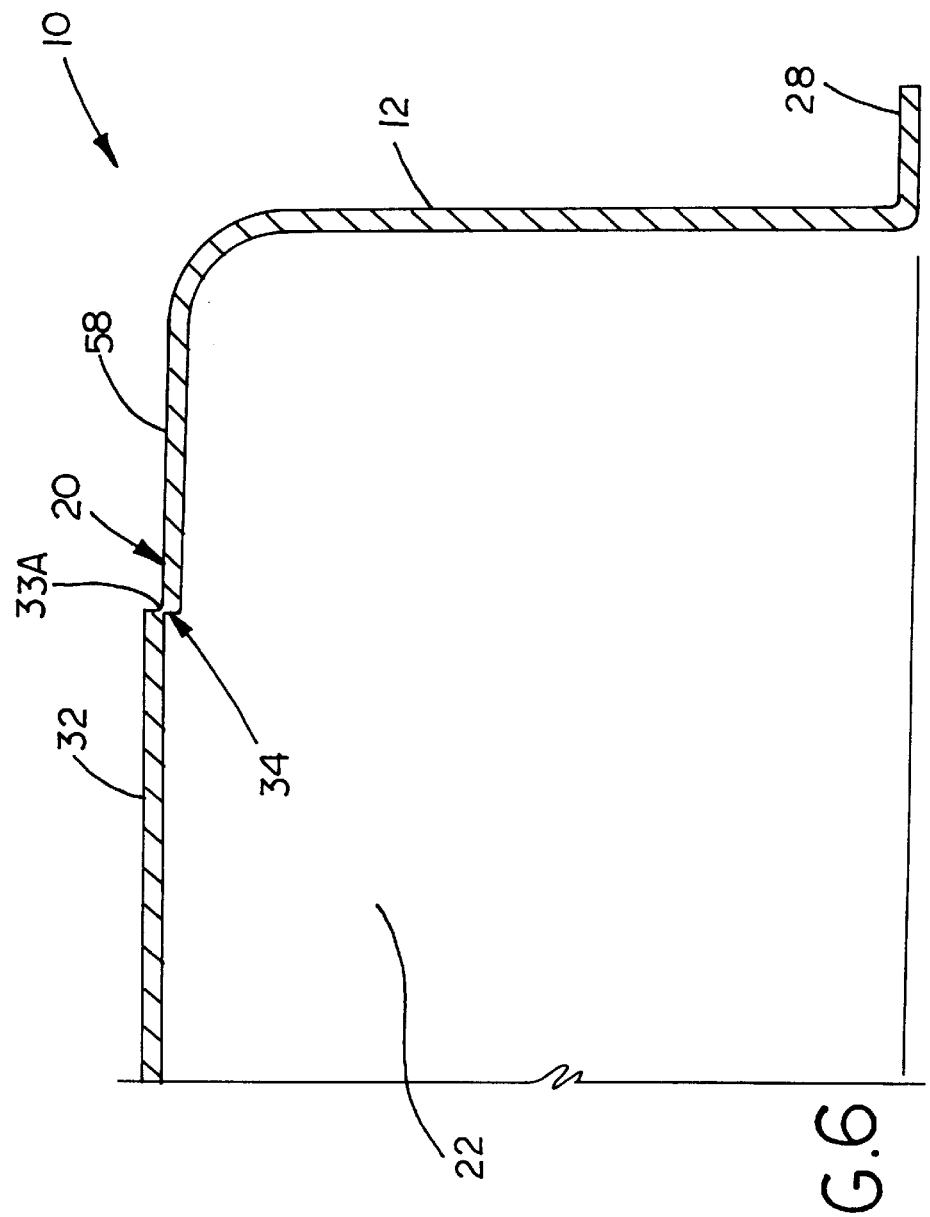
FIG. 6 is an enlarged fragmentary view taken along lines 6—6 of FIG. 5 showing a portion of the frangible connection surrounding the removable cover.

Referring now to FIGS. 1 through 6, the top wall 20 includes a central removable portion 32 which is surrounded and generally defined by a plurality of score lines 33a, 33b, 33c, and 33d, which combine to form a frangible connection 34. As shown in FIG. 6 using the score line 33a as an example, each of the score lines 33a, 33b, 33c, and 33d of the frangible connection 34 will have a thickness that is less than the thickness of the sidewalls 12, 14, 16 and 18. Preferably, the sidewalls 12, 14, 16 and 18 will have a thickness of approximately 0.010 inches or greater, while the frangible connection 34 created by the score lines 33a, 33b, 33c and 33d will have a thickness in the range of approximately 20%–50% of the material thickness. The RF shield 10 and the frangible connection 34 may be formed by stamping, which preferably may be accomplished in a single step using a die as would be known to those of skill in the art.

Figure 1:
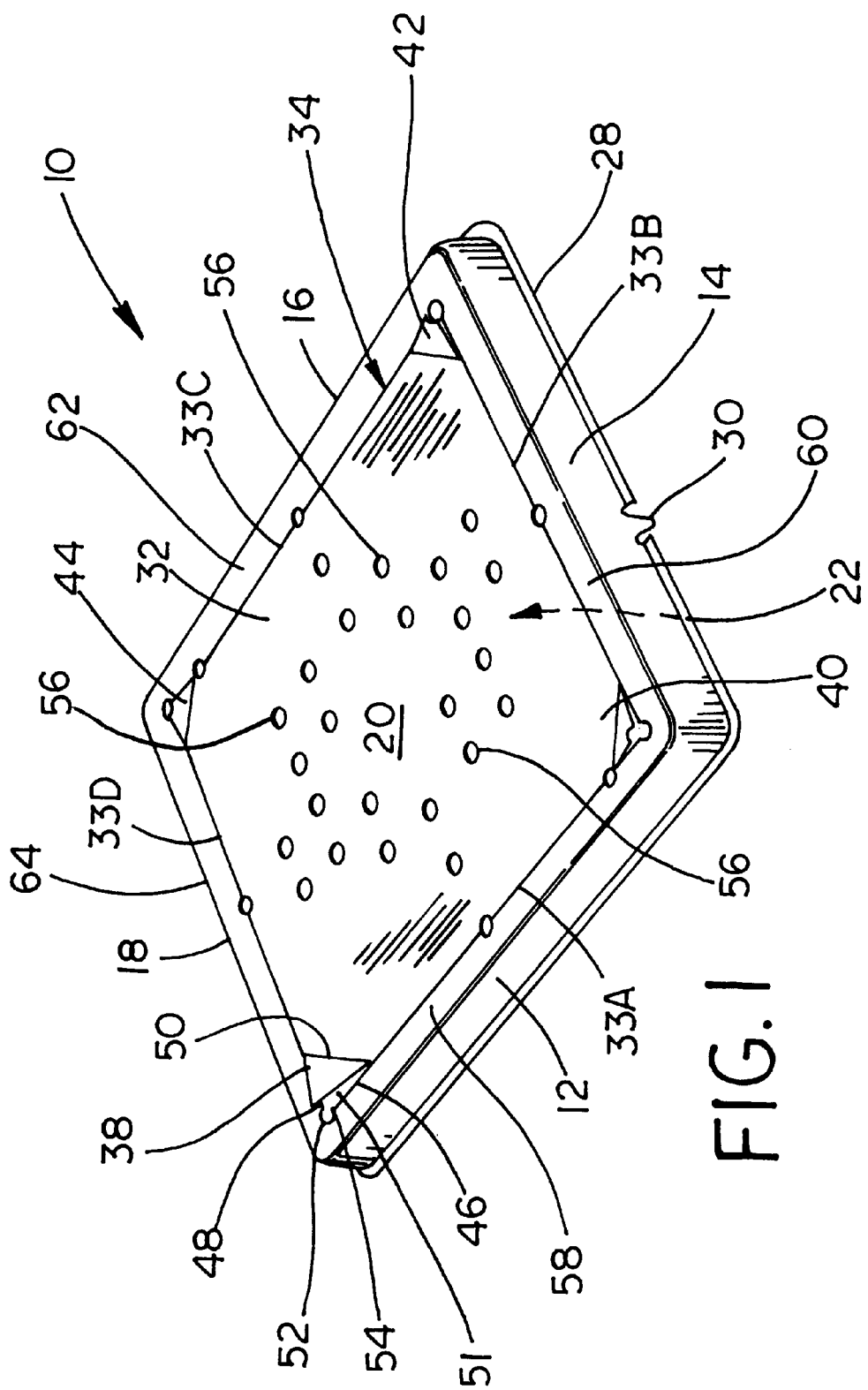
FIG. 1 is a perspective view of an RF shield constructed in accordance with the teachings of the present invention.
Figure 2:
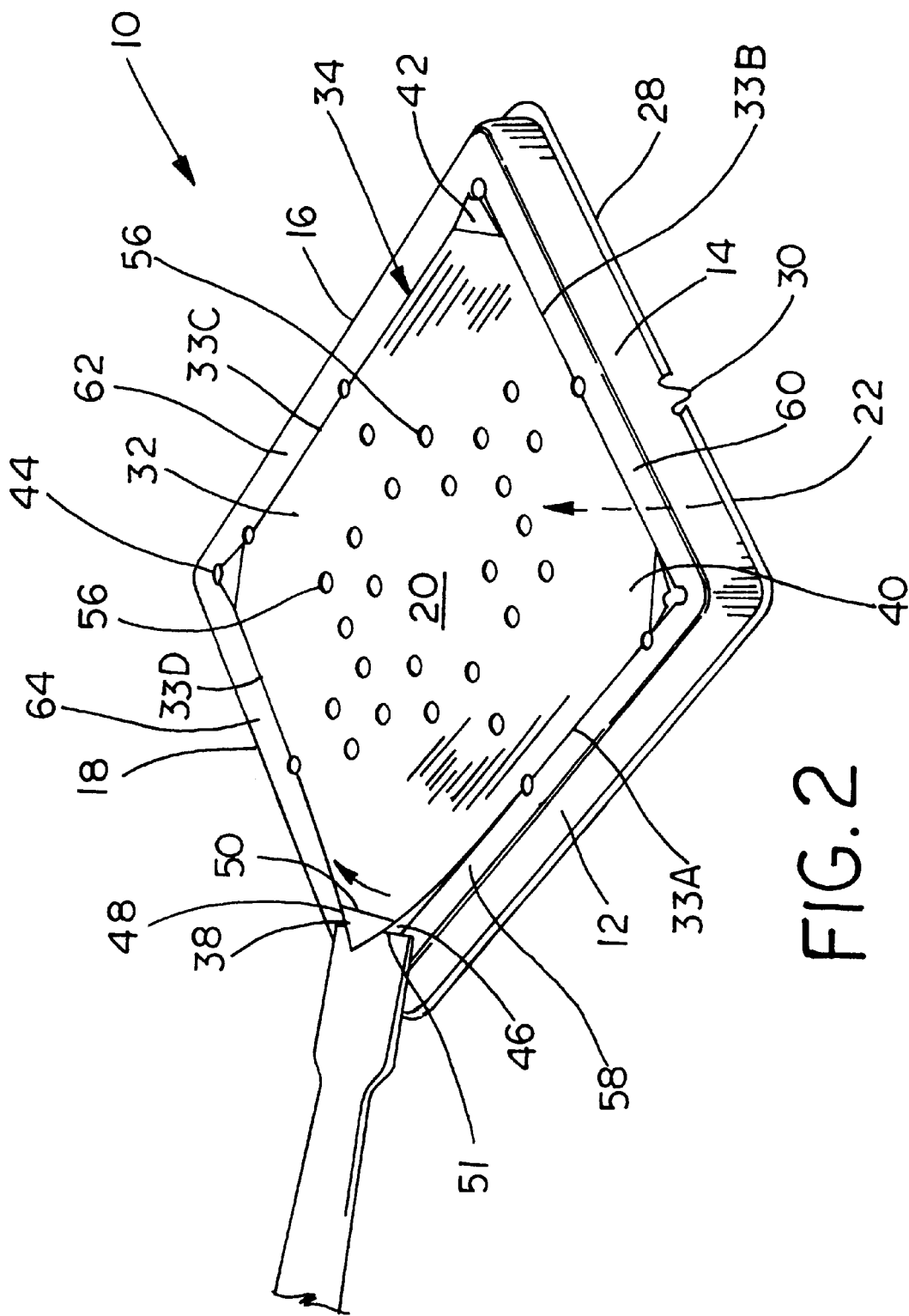
FIG. 2 is a perspective view similar to FIG. 1 and showing the removable cover being removed using a tool such as a screwdriver.
Figure 3:
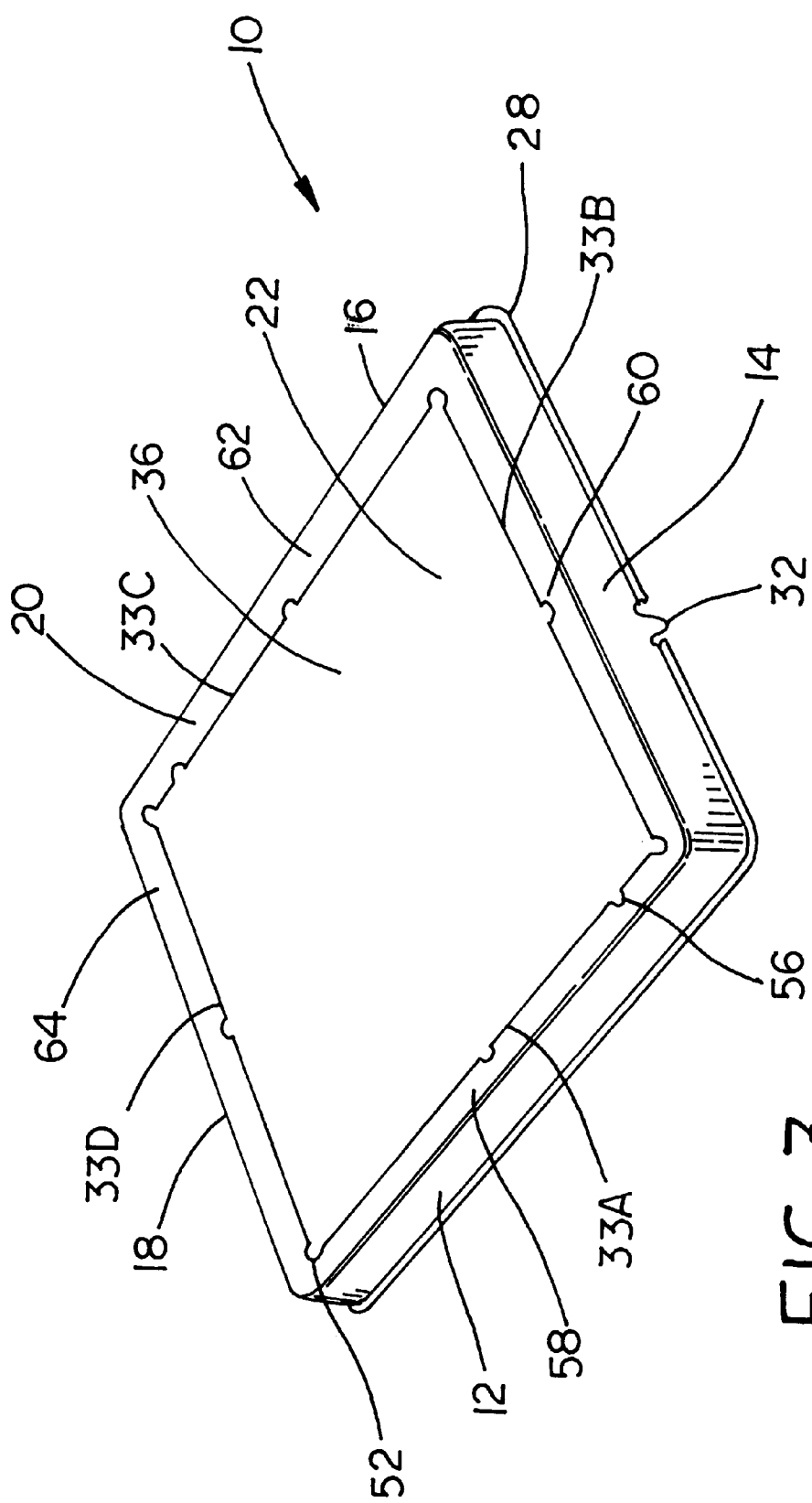
FIG. 3 is a perspective view similar to FIG. 2 but showing a portion of the top wall removed to reveal an access opening.

As shown in FIG. 2, the frangible connection 34 permits removal of the removable portion 32 from the remainder of the top wall 20, such as by applying a prying force using a tool (such as the screwdriver shown) or even a fingernail. As can be seen in FIG. 3, an access opening 36 is created upon removal of the removable portion 32, thus permitting access to the electronic component 24. Further, although FIG. 2 shows the removable portion being removed in a generally upward direction, it will be understood that the removable portion 32 also may be removed by pushing the removable portion 32 into the cavity 22 and then subsequently removing it therefrom.

The removable central portion 32 includes four corners 38, 40, 42 and 44, each of which is preferably angled, canted, or otherwise deflected slightly upwardly away from the planar top surface of the central portion 32. Each of the corners 38, 40, 42 and 44 is substantially identical, and thus for purposes of brevity only the details of a single corner 38 will be described in detail. The corner 38 is generally defined by the intersecting score lines 33a and 33d. The score lines 33a and 33d each include an end portion 46, 48, respectively, which end portions 46, 48 extend fully through the thickness of the top wall 20 of the RF shield 10. The inner extent of the corner portion 38 is defined by an angled crease 50, which permits the corner 38 to be deflected upwardly such that a tool insertion aperture 51 is formed. The end portions 46, 48 of the score lines 33a, 33d, respectively converge at a vertex 54. The corner 38 may also include a perforation 52 at the vertex 54. A plurality of other perforations 56 may also be provided in order to dissipate heat from the electronic component 24 and to improve the life of the tooling used to manufacture the RF shield 10.

Referring now to FIG. 3, the RF shield 10 is shown with the removable central portion 32 removed to create the access opening 36 as explained above. The top wall 20 includes a plurality of outer edge portions 58, 60, 62 and 64 which remain after removal of the removable portion 32. Each outer edge portion 58, 60, 62 and 64 is bounded on its inward edge by an adjacent one of the (now severed) score lines 33a, 33b, 33c and 33d, respectively. Upon removal of the removable portion 32 to create the access opening 36, access to be the electronic component housed within the cavity 22 is possible for purposes of servicing or replacing the electronic component 24.

As shown in FIGS. 7 and 8, subsequent to the servicing or repair of the electronic component 24, it may again be desirable to fully shield the electronic component 24 from the interfering effects of RF. Accordingly, a replacement cover 66 is preferably provided. The replacement cover 66 includes a plurality of side edges 68, 70, 72 and 74, and is sized to cover the access opening 36. Each edge 68, 70, 72 and 74 includes one or more latches 76, each of which is adapted to engage an adjacent one of the outer edges 58, 60, 62 and 64 of the RF shield 10, which edges can be viewed in FIG. 3. Alternatively, the replacement cover 66 may be soldered in place, or a user may cover the opening using grounding tape or other sealing methods as desired. The replacement cover 66 preferably includes at least one upwardly deflected corner 78, which permits removal of the replacement cover 66 in a manner similar to the removal of the removable portion 32 as has been explained above.

In operation, the RF shield 10 is manufactured according to conventional practices by stamping the RF shield 10 from a piece of metal stock using a die (not shown). After assembly of one ore more electronic components 24 on a substrate 26 using conventional practices, the RF shield 10 is placed over a selected component 24 such the component 24 is received within the cavity 22 of the RF shield 10. The mounting projections 30 may be used to secure the RF shield 10 to the substrate 26 in a conventional manner.

Subsequently, should the electronic component 24 require servicing or replacement during its service life, the removable portion 32 can be separated from the RF shield 10 in a manner similar to that shown in FIG. 2 in order to create the access opening 36. A tool (such as the screwdriver shown or any other suitable tool) is inserted into the tool insertion aperture 51 at any one of the four corners 38, 40, 42 and 44. As shown in FIG. 2, the tool is being inserted under the corner 38. By virtue of the score lines 33a and 33d intersecting at the vertex 54 of the corner 38, and by virtue of the end portions 46 and 48 which extend fully through the material, the metal in the frangible connection 34 is easily sheared upon the application of a prying force. As the score lines 33a and 33d are severed, continued application of force causes the score lines 33b and 33c to likewise be severed until the removable portion 32 is no longer attached to the RF shield 10. The electronic component 24 is now accessible through the access opening 36.

Subsequent to servicing or replacing the electronic component 24, the component 24 may again be shielded by installing the replacement cover 66 over the access opening 36. The replacement cover 66 is secured over the opening 36 by pushing in a generally downward direction so that the latches 76 on each of the side edges 68, 70, 72 and 74 engage an adjacent one of the outer edges 58, 60, 62 and 64 of the RF shield 10. The upwardly deflected corner 78 permits subsequent removal of the replacement cover 66 as outlined above.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. An RF shield, comprising:
a plurality of sidewalls and an interconnecting top wall, the sidewalls and the top wall enclosing a cavity adapted to receive therein an electrical component to be shielded, the top wall having a first thickness and including a frangible connection defined by at least one score line circumscribing a removable central portion, the at least one score line having a second thickness less than the first thickness, whereby the frangible connection is severed in response to the application of a force on the central portion, thereby permitting removal of the central portion to form an access opening.

2. The RF shield of claim 1, wherein the central portion includes a plurality of upwardly deflected corner portions.

3. The RF shield of claim 2, wherein each of the corner portions includes a vertex defined by a pair of intersecting score lines, each of the pair of intersecting score lines having an end portion penetrating fully through the first thickness.

4. An RF shield, comprising:
a plurality of sidewalls and an interconnecting top wall, the sidewalls and the top wall enclosing a cavity adapted to receive therein an electrical component to be shielded, the top wall having a first thickness and including a frangible connection defined by at least one score line circumscribing a removable central portion, the at least one score line having a second thickness less than the first thickness, whereby the frangible connection is severed in response to the application of a force on the central portion, thereby permitting removal of the central portion to form an access opening, and wherein the cental portion includes an upwardly deflected corner portion.

5. The RF shield of claim 4, wherein the corner portion is defined by a pair of the score lines intersecting at a vertex, each of the pair of score lines having an end portion disposed adjacent to the vertex, each end portion penetrating fully through the first thickness.

6. The RF shield of claim 5, in combination with a replacement cover sized to cover the access opening.

7. The RF shield of claim 6, wherein the top wall includes a plurality of outer edge portions, each of the outer edge portions being defined in part by an adjacent one of the score lines.

8. The RF shield of claim 7, wherein the replacement cover is adapted to engage the outer edge portions, thereby securing the replacement cover over the access opening.

9. An RF shield adapted for connection to a substrate, the RF shield comprising:
a plurality of sidewalls;
an interconnecting top wall, the sidewalls and the top wall forming a cavity sized to receive therein an electrical component to be shielded, the top wall having a first thickness and including a frangible connection generally circumscribing and defining a removable central portion, the frangible connection being defined in part by a plurality of score lines, each of the score lines having a second thickness less than the first thickness; and
at least one upwardly deflected portion formed in the central portion, the upwardly deflected portion being defined in part by a score line extending fully through the first thickness;
whereby the frangible connection is severed in response to the application of an upward force on the central portion, thereby permitting removal of the central portion to form an access opening.

10. The RF shield of claim 9, wherein the access opening includes a plurality of edge portions, and further including a replacement cover adapted to engage the edge portions thereby covering the access opening.

11. The RF shield of claim 10, wherein each of the edge portions is defined by an adjacent one of the score lines.

12. The RF shield of claim 9, wherein the central portion includes an upwardly deflected corner portion.

13. The RF shield of claim 11, wherein the corner portion is defined by a pair of the score lines intersecting at a vertex, each of the pair of score lines having an end portion disposed adjacent to the vertex, each end portion penetrating fully through the first thickness.

14. The RF shield of claim 9, wherein the central portion includes a plurality of upwardly deflected corner portions.

15. The RF shield of claim 14, wherein each of the corner portions includes a vertex defined by a pair of intersecting score lines, each of the pair of intersecting score lines having an end portion penetrating fully through the first thickness.

16. An RF shield, comprising:
a plurality of sidewalls;
an interconnecting top wall, the sidewalls and the top wall forming a cavity sized to receive therein an electrical component to be shielded, the top wall having a first thickness and including a frangible connection generally circumscribing a removable central portion, the frangible connection being defined in part by a plurality of shear lines, each of the shear lines having a second thickness less than the first thickness, at least two of the shear lines intersecting at a vertex to form a corner portion, each of the at least two shear lines having an end portion disposed adjacent to the vertex, each end portion penetrating fully through the first thickness; and a tool insertion aperture formed in the central portion, the tool insertion aperture being defined in part by a score line penetrating fully through the first thickness, the tool insertion aperture further including an upwardly deflected portion formed in the central portion;

thereby permitting the separation of the central portion from the top wall to form an access opening upon the application of an upward prying force caused by a tool inserted into the tool insertion aperture.

17. The RF shield of claim 16, wherein the access opening includes a plurality of edge portions, and further including a replacement cover adapted to engage the edge portions thereby covering the access opening.

18. An RF shield, comprising:

a plurality of sidewalls;

an interconnecting top wall, the sidewalls and the top wall forming a cavity sized to receive therein an electrical component to be shielded, the top wall having a first thickness and including a frangible connection generally circumscribing a removable central portion, the frangible connection being defined in part by a plurality of shear lines, and wherein the central portion includes a plurality of upwardly deflected corner portions, each of the shear lines having a second thickness less than the first thickness; and a tool insertion aperture formed in the central portion, the tool insertion aperture being defined in part by a score line penetrating fully through the first thickness, the tool insertion aperture further including an upwardly deflected portion formed in the central portion;

thereby permitting the separation of the central portion from the top wall to form an access opening upon the application of an upward prying force caused by a tool inserted into the tool insertion aperture.

19. An RF shield, comprising:

a sidewall;

an interconnecting planar top wall, the sidewall and the top wall forming a cavity sized to receive therein an electronic component to be shielded, the top wall having a first thickness and including a removable central portion being circumscribed by a line of separation, the line of separation being defined by a shear line having a second thickness less than the first thickness;

whereby the central portion is removable along the line of separation by applying a prying force, thereby creating an access opening for accessing the electronic component within the cavity.

* * * * *